US006650717B1

United States Patent
Cupo et al.

(10) Patent No.: US 6,650,717 B1
(45) Date of Patent: Nov. 18, 2003

(54) ASYMMETRIC PULSE AMPLITUDE MODULATION TRANSMISSION OF MULTI-STREAM DATA EMBEDDED IN A HYBRID IBOC CHANNEL

(75) Inventors: Robert Louis Cupo, Eatontown, NJ (US); Mohsen Sarraf, Rumson, NJ (US); Mojtaba Shariat, Matawan, NJ (US); Mohammad Hossein Zarrabizadeh, Woodbrisge, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/293,851

(22) Filed: Apr. 19, 1999

(51) Int. Cl.[7] .......................... H03K 7/02; H04L 27/02; H04L 27/00
(52) U.S. Cl. ..................... 375/353; 375/270; 375/268; 375/261; 375/259
(58) Field of Search ............... 375/265, 262, 375/296, 326, 270, 216, 260, 353, 268; 370/11, 533; 329/311; 327/50, 178; 332/115

(56) References Cited

U.S. PATENT DOCUMENTS

| | | | | |
|---|---|---|---|---|
| 4,660,193 A | * | 4/1987 | Young et al. | 370/11 |
| 5,757,854 A | * | 5/1998 | Hunsinger et al. | 375/260 |
| 5,764,706 A | * | 6/1998 | Carlin et al. | 375/326 |
| 6,005,894 A | * | 12/1999 | Kumar | 375/270 |
| 6,128,334 A | * | 10/2000 | Dapper et al. | 375/216 |
| 6,144,705 A | * | 11/2000 | Papadopoulos et al. | 375/296 |
| 6,243,424 B1 | * | 6/2001 | Kroeger et al. | 375/265 |
| 6,347,122 B1 | * | 2/2002 | Chen et al. | 375/262 |

OTHER PUBLICATIONS

Jeff R. Detweiler, "Conversion Requirements for AM & FM IBOC Transmission", iBiquity Digital Corporation white paper, pp. 1–7.*

Brian W. Kroeger et al., "Compatibility of FM Hybrid In-Band On-Channel (IBOC) System for Digital Audio Broadcasting", IEEE Transactions on Broadcasting, vol. 43, No. 4, pp. 421–430, Dec. 1997.*

* cited by examiner

Primary Examiner—Stephen Chin
Assistant Examiner—Sam K Ahn

(57) ABSTRACT

In accordance with the principles of the present invention, in addition to conventional use of frequency division multiplexed upper and lower side bands, the spectral area occupied by the analog host will be utilized by applying a one-dimensional modulation, e.g., pulse amplitude modulation (PAM) as opposed to the conventional use of a two-dimensional modulation, e.g., quadrature amplitude modulation (QAM). Furthermore, the analog and digital information within the analog host bandwidth may be combined in quadrature to keep the signals orthogonal. Thus, should one side band under the analog carrier be deteriorated or obliterated by adjacent channel interference, the other side band under the analog carrier can still provide useful data and hence better digital audio codec performance. By transmitting one or two digital data streams asymmetrically with respect to the center frequency, particular digital side bands can be rendered useless as environmental conditions warrant (e.g., as they become detrimentally affected by adjacent channel interference), reducing bandwidth capacity but not affecting the quality of the received digital data transmitted in any of the remaining digital side band regions.

26 Claims, 3 Drawing Sheets

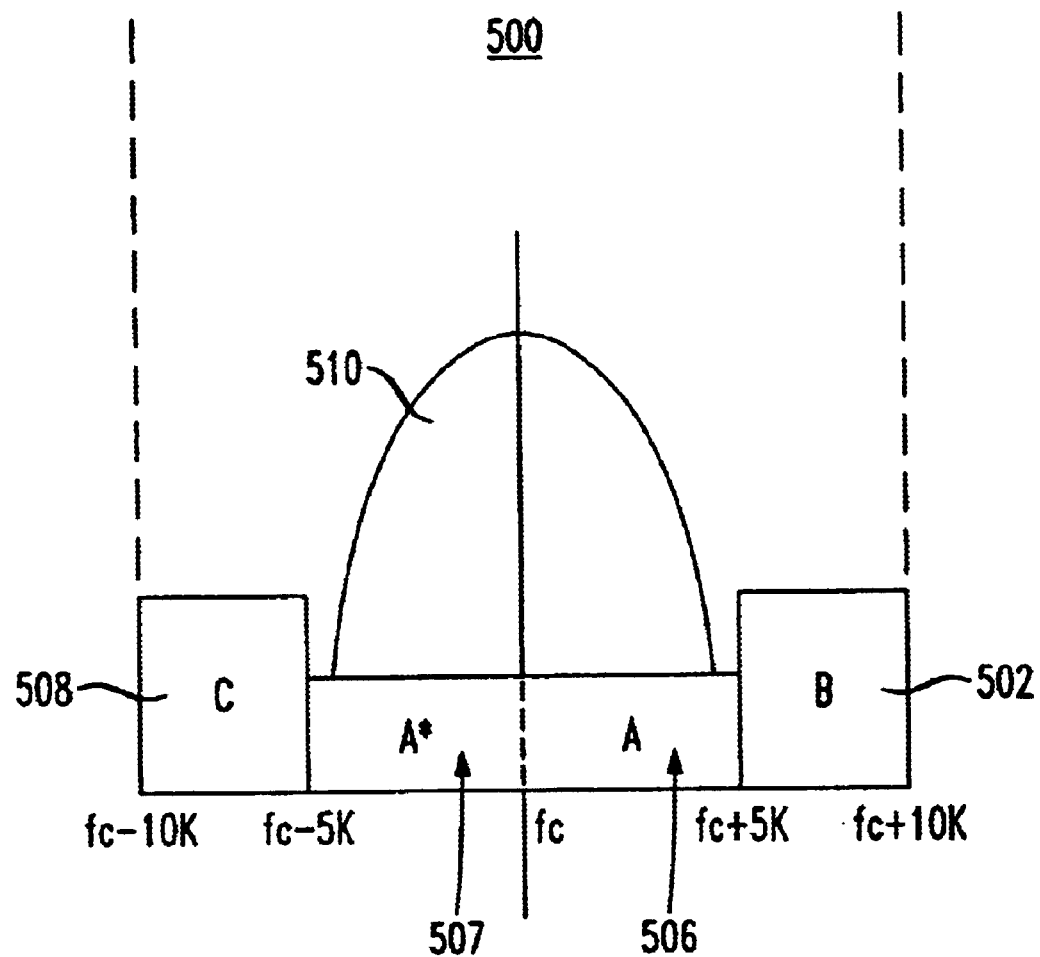

ASYMMETRIC PULSE AMPLITUDE MODULATION TRANSMISSION OF MULTI-STREAM DATA EMBEDDED IN A HYBRID IBOC CHANNEL

BACKGROUND OF THE INVENTION

1. Field of the Invention

This invention relates generally to digital broadcasting. More particularly, it relates to a reliable and robust multi-stream hybrid AM In-Band On-Channel (IBOC) system (HIA) and technique.

2. Background of Related Art

Various methods of broadcasting signals are known. For instance, FM and AM radio are known broadcast techniques. Moreover, In-Band On-Channel (IBOC) digital broadcast systems (more recently also referred to as hybrid IBOC systems) have been proposed for both AM and FM bands. For instance, in AM IBOC systems, both analog and digital audio are transmitted in the same allocated frequency band (i.e., channel).

In conventional AM radio broadcasts, each radio station is assigned a particular frequency band (i.e., channel) for transmission of analog audio signals. While a frequency band of 20 KHz is typically assigned to each channel, only the center 10 KHz is used to provide side band tolerance and isolation between adjacent channels to avoid adjacent channel interference.

FIG. 2 shows a conventional AM channel 400 containing an analog audio signal 410.

In particular, the analog audio signal 410 is ideally 10 KHz wide and centered about the assigned center frequency. Of course, environmental conditions may cause the actual center frequency $f_c$ to vary from the assigned center frequency, possibly interfering with information contained in an adjacent channel. To help avoid adjacent channel interference, the signal transmitted in the AM channel 400 outside of the center 10 KHz is typically required to be attenuated, e.g., −25 dB with respect to the analog audio signal 410 transmitted at the center frequency $f_c$.

More recently, it has been desired to include digital information within and along with conventional AM frequency channels, e.g., 20 KHz frequency bands. Embedding one or more digital data streams within an analog AM channel provides for multiple uses of already crowded frequency spectrum, e.g., for non-commercial broadcasts such as cellular phone transmissions, as well as for commercial broadcasts such as digital television (DTV) or radio services such as AM radio. The digital information streams allow broadcast technology to advance capacity beyond that provided by conventional analog AM broadcast technology, while the analog content continues to allow conventional use of the AM channel allowing backwards compatibility for legacy systems.

One proposed method for embedding multiple digital data streams in a conventional AM channel is shown in FIG. 3.

In particular, in FIG. 3, a typical AM channel 500 includes a host AM analog audio signal 510 together with two digital side band regions 502, 508 and an attenuated region 504 about the center frequency. The upper side band region 502 and the lower side band region 508 are desirably attenuated as required with respect to the level of the AM host analog signal 510. Accordingly, a digital data stream can be transmitted in one, two or all three available digital regions 502, 504 and/or 508 as necessary, all embedded together with a conventional AM audio signal 510.

Conventional systems functioning as that shown in FIG. 3 utilize side bands 502 and 508 for digital transmission. In this spectral area, there is no overlap with the analog host 510. As such, frequency division multiplexing separates analog and digital information.

Because of the narrow band nature of the AM bandwidth, these two side bands 502, 508 do not provide sufficient throughput for typical devices, e.g., a digital audio codec. As such, techniques were sought to include digital transmission in the region occupied by the analog carrier 510. Thus, techniques which take advantage of the one-dimensional nature of the AM analog scheme were sought.

The conventional systems functioning as shown in FIG. 3 allow for digital and analog transmission to co-exist using the same frequencies by placing complementary carriers in quadrature with the analog signal. With the symbols A and their conjugates A* transmitted as shown in FIG. 3, a receiver can retrieve the real part of the transmitted data by adding the symbol with its conjugate. Conversely, the receiver can retrieve the imaginary part of the transmitted data by subtraction. Naturally, since one modulation dimension is supporting the analog host, only one of the two digital modulation dimensions can be detected.

Furthermore, if one of the two bands (A or A*) is severely impaired, retrieval of the transmitted data using addition or subtraction of A and A* will not produce the correct real part of the transmitted data symbol, since the imaginary part cannot be properly canceled by its conjugate. Thus, impairment of either one of the two bands 507, 506 renders both bands 507, 506 essentially useless.

Thus, there is a need for an improved and more robust technique and apparatus for transmitting one or more digital data streams in a conventional AM channel, particularly in the face of adjacent channel interference.

SUMMARY OF THE INVENTION

In accordance with the principles of the present invention, in addition to conventional use of frequency division multiplexed upper and lower side bands, the spectral area occupied by the analog host will be utilized by applying a one-dimensional modulation, e.g., pulse amplitude modulation (PAM) as opposed to the conventional use of a two-dimensional modulation, e.g., quadrature amplitude modulation (QAM).

Furthermore, the analog and digital information within the analog host bandwidth may be combined in quadrature to keep the signals orthogonal. Thus, should one side band under the analog carrier be deteriorated or obliterated by adjacent channel interference, the other side band under the analog carrier can still provide useful data and hence better digital audio codec performance.

BRIEF DESCRIPTION OF THE DRAWINGS

Features and advantages of the present invention will become apparent to those skilled in the art from the following description with reference to the drawings, in which:

FIG. 3 shows a technique for embedding multiple digital data streams in a conventional AM channel.

DETAILED DESCRIPTION OF ILLUSTRATIVE EMBODIMENTS

Symmetrical techniques for embedding digital data streams in a hybrid channel have had previous success. In symmetrical techniques, a symbol A is transmitted in an upper side band region and a complementary conjugate A* to the symbol A is transmitted in an opposite, lower side band, region. Symmetrical transmission techniques require symmetrical filtering as a post process. Unfortunately, if the filtering is not performed perfectly symmetrically, performance in the data transmission will be degraded. Moreover, adjacent channel interference on either side of the carrier frequency (i.e., upper or lower) will cause a loss in symmetry and a corresponding reduction in performance.

The present invention provides an asymmetrical data transmission technique for embedding digital data in an analog channel useful for, e.g., a 20 KHz Hybrid AM IBOC (HIA) multi-stream perceptual audio coder (PAC). Asymmetrical techniques such as that disclosed herein are immune to performance reductions caused by asymmetry between data transmitted in an upper side band and data transmitted in the complementary lower side band, e.g., as a result of adjacent channel interference. Instead of a loss of data in both bands, a loss of transmission bandwidth occurs only where channel conditions are poor.

In particular, the present invention provides an asymmetrical transmission technique of transmitting different bits in the upper and lower digital side bands. In contrast, the conventional symmetrical technique transmits the I and Q components of the 2-bit symbol (i.e., A (506) and A*(507) as shown in FIG. 3) in the upper and lower side band regions, respectively. Thus, in the conventional technique, both the upper side band region and the lower side band region contain a representation of the 2-bit symbol.

In the spectral area which must co-exist with the analog host, a one-dimensional modulation technique, e.g., pulse amplitude modulation (PAM) IBOC technique is used rather than the conventional two-dimensional modulation technique, e.g., quadrature amplitude modulation (QAM) IBOC technique for modulating the embedded digital data stream in an AM channel.

In side bands 502 and 508, conventional QAM is preferably utilized to provide maximum bandwidth efficiency due to the lack of the analog host in these spectral regions.

By transmitting the digital data asymmetrically with respect to the center frequency $f_c$, particular digital side band regions can be left un-utilized as environmental conditions warrant (e.g., as adjacent channel interference makes such side band regions unusable), reducing bandwidth capacity but not affecting the quality of the received digital data transmitted in any of the remaining digital side band regions.

Figure 1:
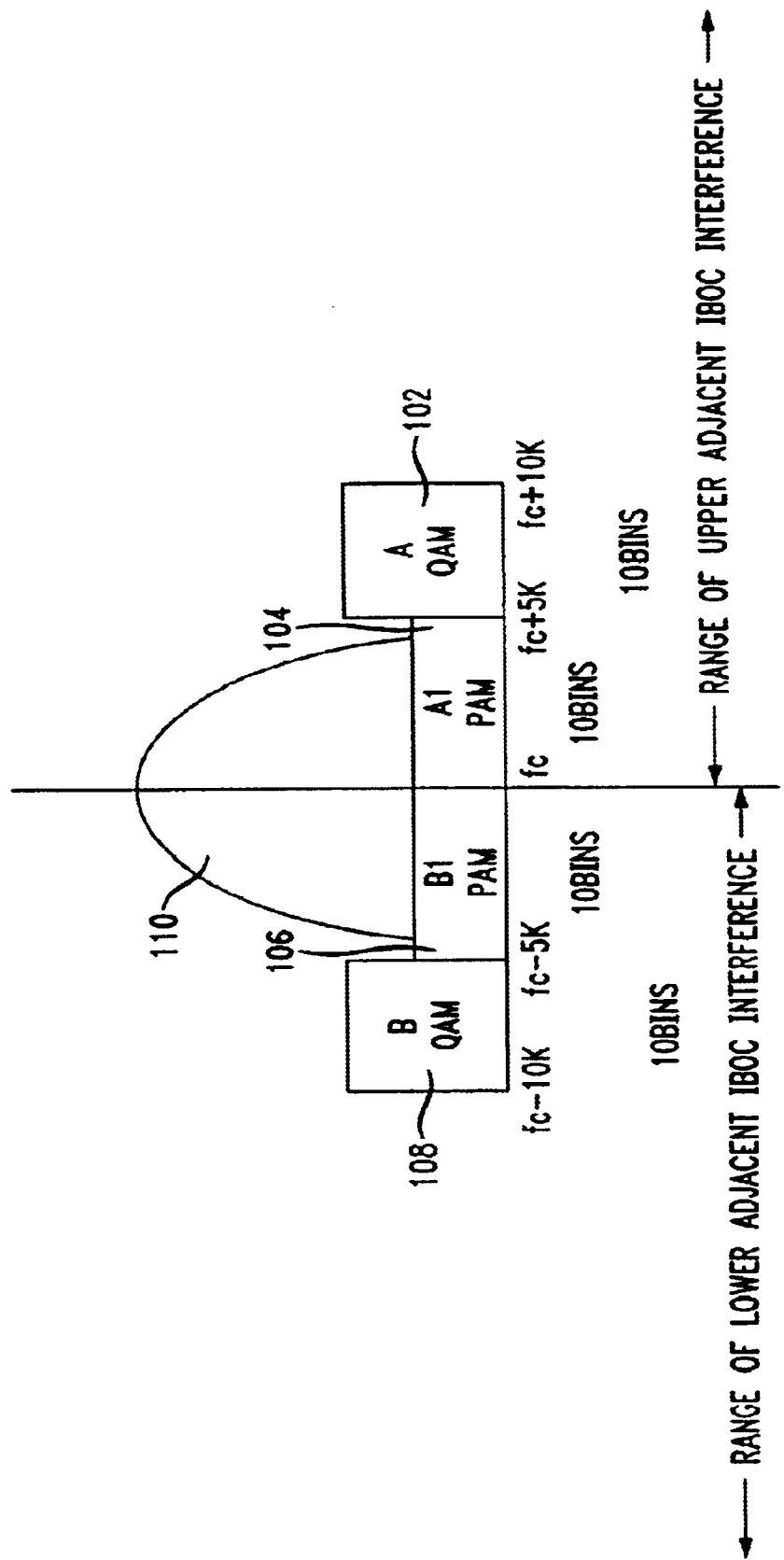
FIG. 1 shows a spectral allocation assignment for a 20 KHz HIA system, including asymmetrical transmission of one or two digital data streams without conjugate symbol transmission, in accordance with the principles of the present invention.
Figure 2:
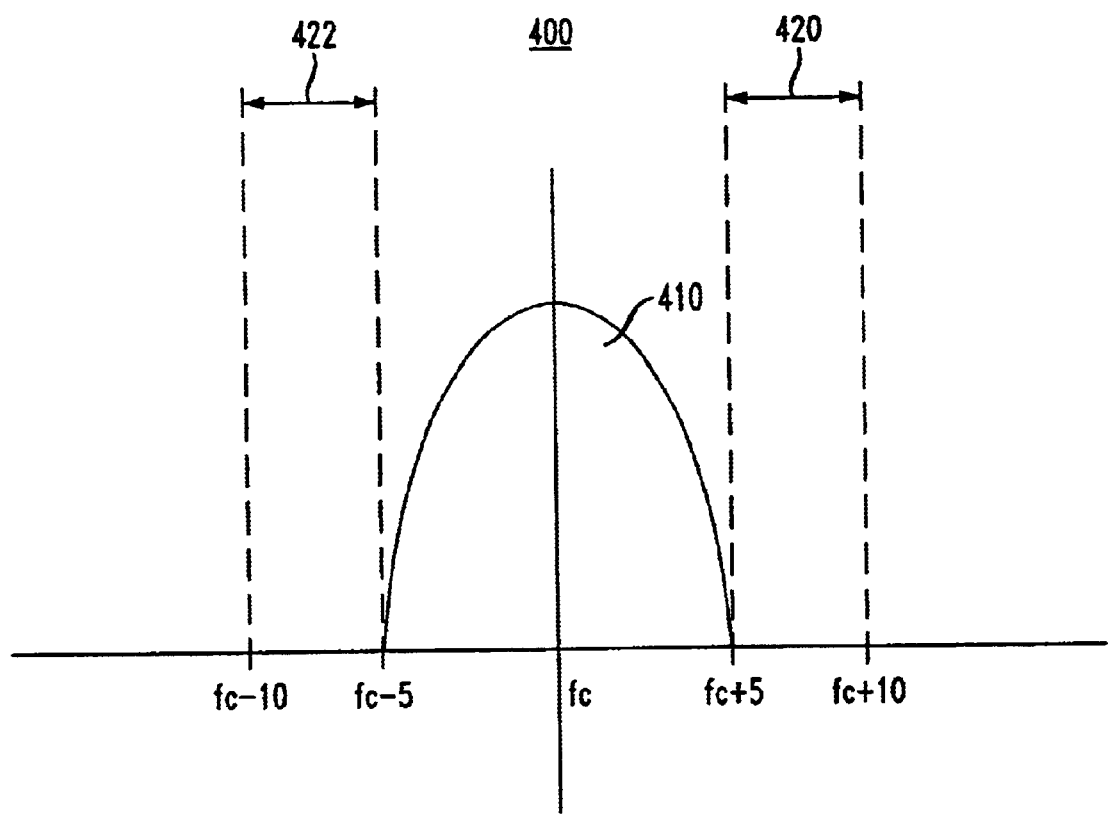
FIG. 2 shows a conventional AM channel containing an analog audio signal.

FIG. 1 shows a spectral allocation assignment for a 20 KHz HIA system, including asymmetrical transmission of one or two digital data streams without conjugate symbol transmission, in accordance with the principles of the present invention.

In particular, in FIG. 1, the 20 KHz spectrum is divided into four (4) 5 KHz side band regions labeled A (102), A1 (104), B1 (106), and B (108), respectively, in a direction from upper side band to lower side band.

As discussed, adjacent channel interference may affect the upper side band regions A (102) and A1 (104) and/or the lower side band regions B (108) and B1 (106). Upper adjacent IBOC interference is shown in FIG. 1 in a range in which it affects the upper side band regions A (102) and A1 (104), and lower adjacent IBOC interference is shown in FIG. 1 in a range in which it affects the lower side band regions B (108) and B1 (106). 20 KHz, the typical AM channel range, has been assumed for current operating conditions for both Hybrid and All-Digital AM IBOC systems. Thus, the interference range is the same for either adjacent channel.

Given any significant adjacent channel interferer (ACI), half of the bandwidth of the HIA system may be affected. For that reason, it is preferred that no more than two simultaneous digital data streams (A (102) and A1 (104)) and (B (108) and B1 (106)) be embedded in any given AM channel.

An upper adjacent channel interferer will affect the upper side bands A (102) and A1 (104). Similarly, a lower adjacent channel interferer will affect the lower side bands B (108) and B1 (106). Thus, the conventional symmetrical transmission of complementary representations of FIG. 3 would render transmission in regions A (506), A* (507), and B (502) useless in the case of severe upper adjacent channel interference. Alternatively, lower adjacent channel interference would obliterate bands A (506), A* (507), C (508).

Use of conventional complementary carriers with one-sided adjacent channel interference causes a loss of ⅔ of the transmission bandwidth, since the A (506) and A* (507) regions shown in FIG. 3 together typically carry as much bandwidth as either of the side band regions C (508) or B (502).

In contrast, in accordance with the principles of the present invention, use of a one-dimensional technique (e.g., pulse amplitude modulation (PAM)) in the regions A1 (104), B1 (106) shown in FIG. 1 below the analog host 110 will lose at most only ½ of the bandwidth. Thus, either the entire upper band A (102), A1 (104) or the entire lower band B (108), B1 (106) will be useable with reduced audio quality. Nevertheless, this reduced audio quality will still be superior to that provided by the conventional use of complementary carriers because of the additional data throughput.

In accordance with the principles of the present invention, all of the digital data information and associated error protection bits (e.g., cyclic redundancy check (CRC) bits) for each transmitted digital data stream are allocated to "bins" on the same side (i.e., upper or lower) of the analog carrier 110. If two digital data streams are being transmitted, then one digital data stream would be transmitted in a lower side band region B (108) and B1 (106), and the other digital data stream would be transmitted in the upper side band region A (102) and A1 (104).

Throughputs for both a single digital data stream embedded in an HIA channel and for a dual digital data stream embedded in opposite sides of an HIA channel are now analyzed for asymmetrical transmission in accordance with the principles of the present invention.

For the single digital data stream embodiment, it is determined that it would be advantageous (particularly in light of one or two adjacent channel interference) to transmit the digital data stream on one side of the analog carrier 110, e.g., in side band regions A (102) and A1 (104), and another separate digital data stream on the other side of the analog carrier 110, e.g., in side band regions B (108) and B1 (106). To do this, a one-dimensional modulation scheme is preferred, e.g., pulse amplitude modulation (PAM), in the regions below the analog host, i.e., A1 (104) and B1 (106), and a two-dimensional modulation scheme is preferred, e.g., quadrature amplitude modulation (QAM), in the side band regions A (102) and B (108).

In a disclosed embodiment, a four (4) level PAM is proposed to transmit a digital data stream in side band regions A1 (104) and B1 (106) regardless of the type of modulation used in the other side band regions A (102) and B (108). This allows for the analog portion of the HIA to be in quadrature with the side band regions A1 (104) and B1 (106).

Naturally, training frames could use a simpler modulation scheme in any or all of the bins if increased robustness during training is desired. For instance, if ten (10) bins exist in side band region A1 (104) (or equivalently in side band region B1 (106)), a maximum throughput in the given embodiment wherein each symbol comprises 2 bits can be calculated as:

A1=10 bins×430.6640625 symbols/second×2 bits/symbol=8613 bps

Symbol bits are then allocated to the ten (10) bins of side band regions A (102) or B (108). Assume that every (n+1) total frames will include one (1) frame of training information. Thus, for instance, during n frames of audio information, a total payload of n+1 frames of audio information will be transmitted.

Moreover, coding overhead c will be accounted for in each frame. Thus, the maximum throughput in side band regions A (102) or B (108) is calculated as:

A=10 bins×430.6640625×(b) bits/symbol

The results of total throughput of digital side band regions A & A1 (or B & B1) vs. a chosen modulation scheme are summarized in Table I below.

TABLE I

| Modulation Scheme for side band regions A or B | Total Throughput of side band regions A & A1 or B & B1 |
|---|---|
| 16 QAM | 25.8 Kb/s |
| 32 QAM | 30.1 Kb/s |

In the case of embedding two digital data streams within a single HIA channel, the effective coding rates are calculated given the desirability to transmit one training frame every, e.g., eight (8) total frames.

A dual-stream rate of (16 Kb/s, 32 Kb/s) may be made available in an application including a perceptual audio coder (PAC) device. In such a scenario, half of the channel spectrum must carry information at a 16 Kb/s rate. Applying the exemplary 16 QAM format, the operative equation would become:

16 Kb/s rate/frame×8 frames=25.8 Kb/s channel rate×7 frames×c

Another embodiment discloses a dual-stream PAC rate of (24 Kb/s, 48 Kb/s). It is currently unlikely that conventional 16 QAM modulation schemes can handle this audio information rate. Thus, only 32 QAM is considered for this embodiment. Of course, the principles of the present invention relate to any rate modulation scheme.

Table II below summarizes allowable coding overhead for dual-stream schemes with respect to modulation formats, coding rates, and training frame rates, given the assumption of one (1) training frame every eight (8) total frames.

TABLE II

| PAC Rates (Kb/s) | Modulation on Side Band Regions A or B | FEC Coding Rate | Training Rate (frames) |
|---|---|---|---|
| (16,32) | 16 QAM | 0.7 | 1/8 |
| (16,32) | 32 QAM | 0.6 | 1/8 |
| (24,48) | 32 QAM | 0.92 | 1/8 |
| (21,42) | 32 QAM | 0.8 | 1/8 |

Accordingly, given adjacent channel interference conditions (particularly from both sides), HIA embedded data streams are preferably limited to a maximum of two. Moreover, based on the results shown in Table II, the preferred technique is the (16 Kb/s, 32 Kb/s) PAC mode.

A preference (if any) between 16 QAM or 32 QAM can be based on simulation given the particular application. Moreover, a 42 Kb/s PAC mode should be preferred over a 48 Kb/s PAC mode as the high rate public relations solution mode selectable by broadcasters. However, relative to the preferred technique of the (16 Kb/s, 32 Kb/s) PAC mode, the performance of a 42 Kb/s PAC mode would be inferior with respect to coverage area, but superior with respect to audio performance.

While disclosed with respect to an embodiment describing a 20 KHz AM channel, the principles of the present invention are equally applicable to other size frequency channels.

While the invention has been described with reference to the exemplary embodiments thereof, those skilled in the art will be able to make various modifications to the described embodiments of the invention without departing from the true spirit and scope of the invention.

What is claimed is:

1. An embedded digital data stream in an analog channel, comprising:

a first portion of a data symbol transmitted in an upper side band region within said analog channel; and a second portion of said data symbol transmitted in a lower side band region within said analog channel;

wherein said first portion of said data symbol is asymmetrical with respect to said second portion of said data symbol and at least one of said first portion of said data symbol and said second portion of said data symbol utilizes pulse amplitude modulation.

2. The embedded digital data stream in an analog channel in accordance with claim 1, further comprising:

an analog signal centered substantially about a center frequency of said analog channel.

3. The embedded digital data stream in an analog channel in accordance with claim 2, wherein:

an amplitude of said upper side band region is attenuated at least 25 decibels with respect to an amplitude of said analog signal.

4. The embedded digital data stream in an analog channel in accordance with claim 1, wherein:

said analog channel is formed by an In-Band, On-Channel system.

5. The embedded digital data stream in an analog channel in accordance with claim 4, wherein:

said In-Band, On-Channel system is a hybrid AM In-Band, On-Channel system.

6. The embedded digital data stream in an analog channel in accordance with claim 1, wherein:

said analog channel includes at most two embedded digital data streams.

7. The embedded digital data stream in an analog channel in accordance with claim 1, wherein:

said embedded digital data stream is comprised in a perceptual audio coder.

8. An in-band on-channel transmission, comprising:

an analog host;

at least one digital data region within said analog host;

a second digital data region within an upper sideband portion above a frequency range of said analog host; and a third digital data region within a lower sideband portion below a frequency range of said analog host;

wherein at least two of said at least one digital data region, said second digital data region and said third digital data region are asymmetrical and digital data within at least one of said at least one digital data region, said second digital data region and said third digital data region are modulated using a one-dimensional technique.

9. The in-band on-channel transmission according to claim 8, wherein:

said one-dimensional technique is pulse amplitude modulation.

10. The in-band on-channel transmission according to claim 8, wherein:

digital data within said second digital data region and said third digital data region are modulated using a two-dimensional technique.

11. The in-band on-channel transmission according to claim 10, wherein:

said two-dimensional technique is quadrature amplitude modulation.

12. The in-band on-channel transmission according to claim 8, wherein:

there are two digital data regions within said analog host.

13. A method of embedding a digital data stream in an analog channel, comprising:

providing an analog signal in said analog channel about a center frequency;

modulating a first digital data stream in a region corresponding to said analog signal using a one-dimensional technique; and modulating a second digital data stream in a region outside of said analog signal using a two-dimensional technique;

wherein said first digital data stream and said second digital data stream are asymmetric.

14. The method of embedding a digital data stream in an analog channel according to claim 13, wherein:

said one-dimensional technique is pulse amplitude modulation.

15. The method of embedding a digital data stream in an analog channel according to claim 14, wherein:

said two-dimensional technique is quadrature amplitude modulation.

16. The method of embedding a digital data stream in an analog channel according to claim 13, wherein:

said two-dimensional technique is quadrature amplitude modulation.

17. The method of embedding a digital data stream in an analog channel according to claim 13, further comprising:

attenuating an amplitude of said region outside of said analog signal at least 25 decibels with respect to an amplitude of said analog signal.

18. The method of embedding a digital data stream in an analog channel according to claim 13, wherein:

said analog channel is formed by an In-Band, On-Channel system.

19. The method of embedding a digital data stream in an analog channel according to claim 18, wherein:

said In-Band, On-Channel system is a hybrid AM In-Band, On-Channel system.

20. The method of embedding a digital data stream in an analog channel according to claim 13, wherein:

said embedded digital data stream is comprised in a perceptual audio coder.

21. The method of embedding a digital data stream in an analog channel according to claim 13, further comprising:

suspending use of one of said first digital data stream and said second digital data stream as a corresponding region becomes detrimentally affected by interference.

22. The method of embedding a digital data stream in an analog channel according to claim 21, wherein:

said interference includes adjacent channel interference.

23. Apparatus for embedding a digital data stream in an analog channel, comprising:

means for providing an analog signal in said analog channel about a center frequency;

means for modulating a first digital data stream in a region corresponding to said analog signal using a one-dimensional technique; and means for modulating a second digital data stream in a region outside of said analog signal using a two-dimensional technique;

wherein said first digital data stream and said second digital data stream are asymmetric.

24. The apparatus for embedding a digital data stream in an analog channel according to claim 23, wherein:

said one-dimensional technique is pulse amplitude modulation.

25. The apparatus for embedding a digital data stream in an analog channel according to claim 24, wherein:

said two-dimensional technique is quadrature amplitude modulation.

26. The apparatus for embedding a digital data stream in an analog channel according to claim 23, wherein:

said two-dimensional technique is quadrature amplitude modulation.

* * * * *